United States Patent
Rachala et al.

(10) Patent No.: US 10,458,857 B2
(45) Date of Patent: Oct. 29, 2019

(54) ACCURATE ON-CHIP TEMPERATURE SENSING USING THERMAL OSCILLATOR

(71) Applicant: Advanced Micro Devices, Inc., Santa Clara, CA (US)

(72) Inventors: Ravinder Reddy Rachala, Austin, TX (US); Stephen Victor Kosonocky, Fort Collins, CO (US); Stephen C. Ennis, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 45 days.

(21) Appl. No.: 15/902,101

(22) Filed: Feb. 22, 2018

(65) Prior Publication Data
US 2019/0257696 A1 Aug. 22, 2019

(51) Int. Cl.
| | |
|---|---|
| G01R 23/00 | (2006.01) |
| G01K 7/01 | (2006.01) |
| G06F 1/3296 | (2019.01) |
| G01K 7/32 | (2006.01) |
| H03K 3/03 | (2006.01) |

(52) U.S. Cl.
CPC ............ *G01K 7/01* (2013.01); *G06F 1/3296* (2013.01); *G01K 7/32* (2013.01); *H03K 3/0315* (2013.01)

(58) Field of Classification Search
CPC .......... G01K 7/01; G01K 7/32; G06F 1/3296; H03K 3/0315
USPC ....................................... 331/44, 57, 66, 176
See application file for complete search history.

(56) References Cited

U.S. PATENT DOCUMENTS

| | | | | |
|---|---|---|---|---|
| 6,115,441 A | * | 9/2000 | Douglass | G01K 1/028 374/163 |
| 7,831,873 B1 | * | 11/2010 | Trimberger | G01K 7/32 327/512 |
| 2002/0181543 A1 | * | 12/2002 | Yin | G01K 7/203 374/170 |

* cited by examiner

*Primary Examiner* — Richard Tan
(74) *Attorney, Agent, or Firm* — Polansky & Associates, P.L.L.C.; Paul J. Polansky (57) ABSTRACT

A calibrated temperature sensor includes a power on oscillator responsive to a calibration enable signal for providing a power on clock signal, a temperature dependent oscillator responsive to said calibration enable signal for providing a temperature dependent clock signal, and a measurement logic circuit. The measurement logic circuit counts a first number of pulses of the temperature dependent clock signal during a first calibration period using the power on clock signal, a second number of pulses of the temperature dependent clock signal during a second calibration period using a system clock signal, and a third number of pulses of the power on clock signal over a third calibration period using the system clock signal, and a fourth number of pulses of the temperature dependent clock signal using the system clock signal during a normal operation mode, wherein the first calibration period precedes both the second and third calibration periods.

20 Claims, 5 Drawing Sheets

ACCURATE ON-CHIP TEMPERATURE SENSING USING THERMAL OSCILLATOR

BACKGROUND

Modern integrated circuit microprocessors and systems-on-chip with data processing cores are able to perform large numbers of computations at relatively high clock speeds. These high speeds can cause the integrated circuit die to heat up significantly. These integrated circuits frequently include on-chip temperature sensors to determine die temperature and to make power management decisions based on how close the integrated circuit die is to its thermal limits. For example when die temperature becomes too high, the speed of the clocks can be lowered or "throttled" so that the circuit can continue to operate properly, albeit at a lower performance level.

On-die temperature can be measured by a variety of circuits. For example the current through a resistor or a semiconductor diode varies with temperature, and the integrated circuit can infer the die temperature by measuring these currents. It is also possible to measure the die temperature using a temperature dependent ring oscillator (TRO). The TRO outputs a clock signal whose frequency is a function of temperature. The frequency of the TRO however is dependent not only on temperature but also on other factors such as manufacturing process variations. Known integrated circuits calibrate the temperature sensors, such as TROs, to obtain a baseline temperature measurement against a standard and then infer the temperature based on the deviation of the measurement from the standard. However it is difficult to perform accurate temperature calibration when the temperature sensors and other circuits in the chip use the same power supply voltage and heat up the die after power is applied and thereby distort the baseline calibration measurement.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well. Additionally, the terms remap and migrate, and variations thereof, are utilized interchangeably as a descriptive term for relocating.

DETAILED DESCRIPTION OF ILLUSTRATIVE EMBODIMENTS

As will be described in detail below, in one form a calibrated temperature sensor includes a power on oscillator responsive to a calibration enable signal for providing a power on clock signal, a temperature dependent oscillator responsive to said calibration enable signal for providing a temperature dependent clock signal, and a measurement logic circuit. The measurement logic circuit counts a first number of pulses of the temperature dependent clock signal during a first calibration period using the power on clock signal, a second number of pulses of the temperature dependent clock signal during a second calibration period using a system clock signal, and a third number of pulses of the power on clock signal over a third calibration period using the system clock signal, and a fourth number of pulses of the temperature dependent clock signal using the system clock signal during a normal operation mode, wherein the first calibration period precedes both the second and third calibration periods.

In another form, an integrated circuit includes a functional unit for receiving a power supply voltage and performing a predetermined operation in a normal operation mode in response to said power supply voltage. The function units includes a calibrated temperature sensor that operates using said power supply voltage and provides a temperature signal in a normal operation mode. The calibrated temperature sensor includes a power on oscillator responsive to a calibration enable signal for providing a power on clock signal, a temperature dependent oscillator responsive to said calibration enable signal for providing a temperature dependent clock signal, and a measurement logic circuit. The measurement logic circuit counts a first number of pulses of the temperature dependent clock signal during a first calibration period using the power on clock signal, a second number of pulses of the temperature dependent clock signal during a second calibration period using a system clock signal, and a third number of pulses of the power on clock signal over a third calibration period using the system clock signal, and a fourth number of pulses of the temperature dependent clock signal using the system clock signal during a normal operation mode, wherein the first calibration period precedes both the second and third calibration periods.

In yet another form, a method includes providing a power on clock signal in response to a calibration enable signal, and a temperature dependent clock signal using a temperature dependent oscillator in response to the calibration enable signal. A first number of pulses of the temperature dependent clock signal is counted during a first calibration period using the power on clock signal. A second number of pulses of the temperature dependent clock signal is counted during a second calibration period using a system clock signal. A third number of pulses of the power on clock signal is counted over a third calibration period using the system clock signal, wherein the first calibration period precedes both the second and third calibration periods. A fourth number of pulses of the temperature dependent clock signal is counted using the system clock signal during a normal operation mode.

Figure 1:
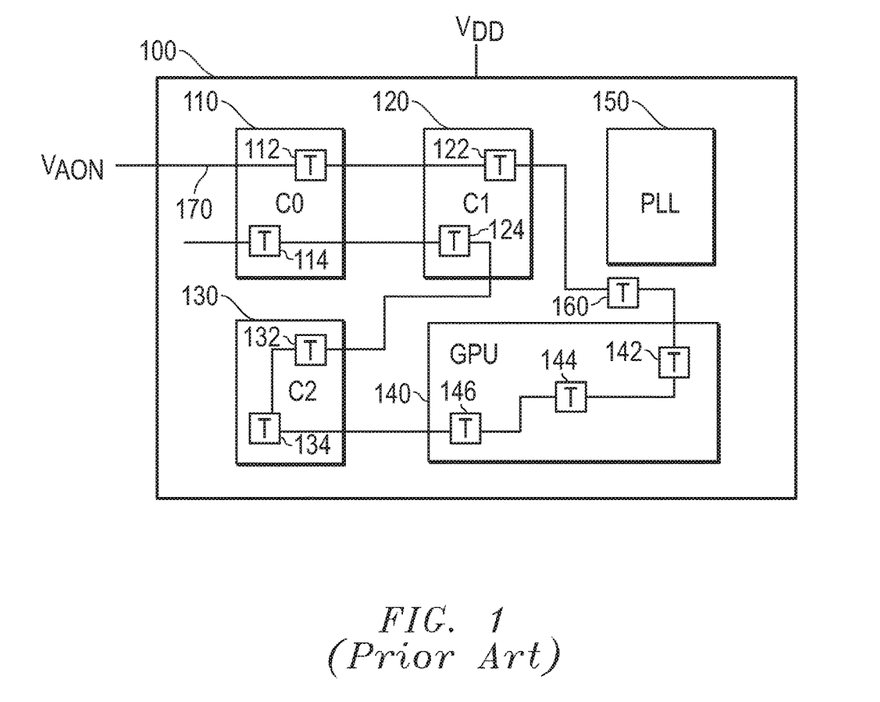
FIG. 1 illustrates in block diagram form an integrated circuit with temperature sensing known in the prior art.

FIG. 1 illustrates in block diagram form an integrated circuit 100 with temperature sensing known in the prior art. Integrated circuit 100 includes three central processing unit (CPU) cores 110, 120, and 130 labeled "C0", "C1", and "C2", respectively, a graphics processing unit (GPU) core 140, a phase locked loop (PLL) 150, and a temperature sensor 160. Integrated circuit 100 receives an always-on power supply voltage labeled "VAON" that can have a value of, for example, 1.8 volts with respect to ground. CPU core 110 includes temperature sensors 112 and 114, each of which receives power supply voltage VAON. CPU core 120 includes temperature sensors 122 and 124, each of which receives power supply voltage VAON. CPU core 130 includes temperature sensors 132 and 134, each of which receives power supply voltage VAON. GPU core 140 includes temperature sensors 142, 144, and 146, each of which receives power supply voltage VAON. PLL 150 is located close to temperature sensor 160, which receives power supply voltage VAON.

Integrated circuit 100 avoids the distortion on temperature measurement caused by leakage effects by providing a special power supply voltage VAON. Power supply voltage VAON is always on and is used to power only the temperatures sensors. Thus VAON can allow the temperature sensors that are distributed throughout integrated circuit 100 to make measurements while CPU cores 110, 120, and 130, GPU core 140, and PLL 150 are powered down. However this technique requires power supply voltage VAON to be routed independently throughout the integrated circuit 100 and causes difficulties in layout and floor-planning of the chip. It also requires the system designer to provide a special power supply voltage, increases the pin count of integrated circuit 100, and complicates the design of the external voltage regulator. All of these factors increase product cost.

Figure 2:
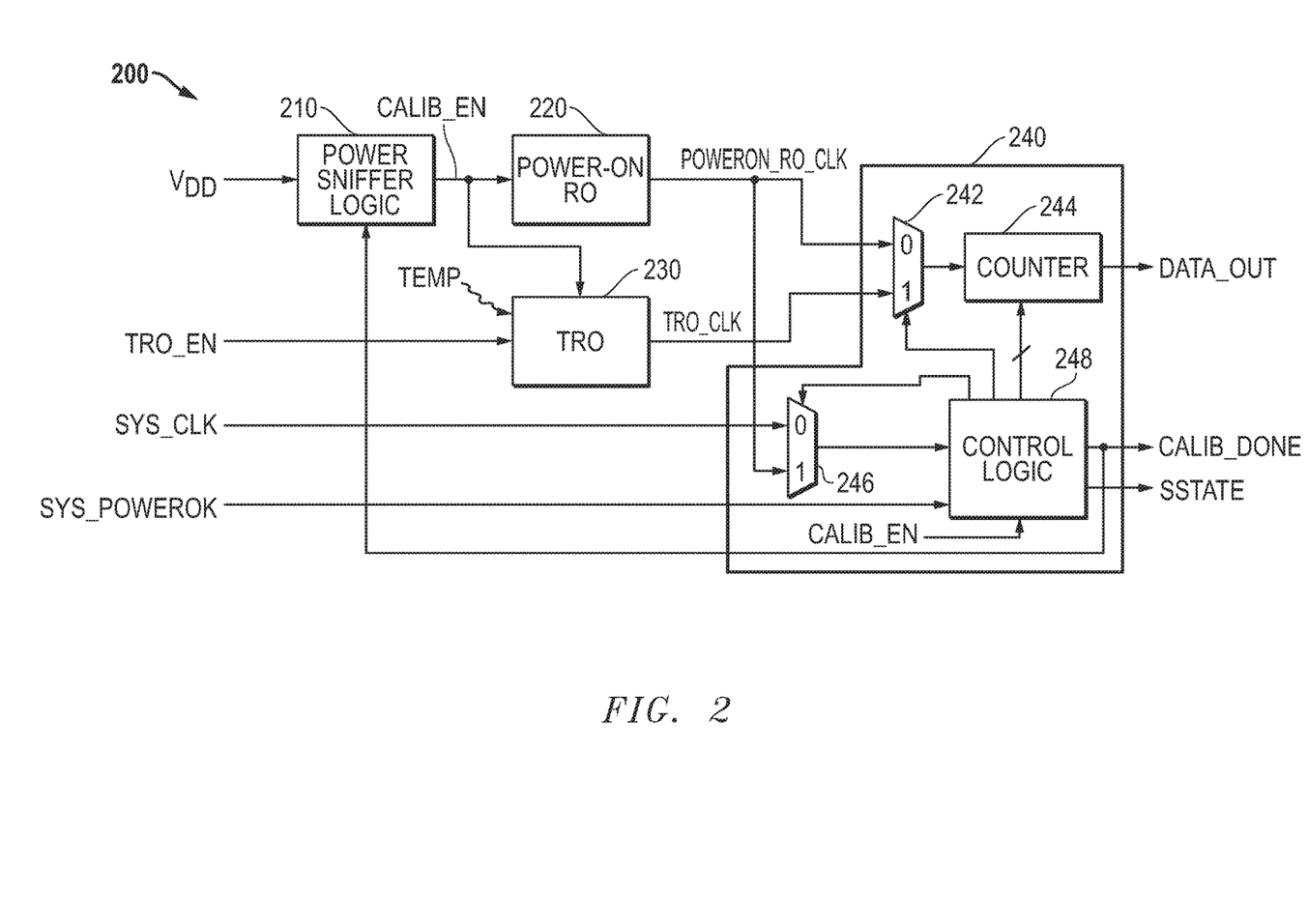
FIG. 2 illustrates in block diagram form a calibrated temperature sensor according to some embodiments.

FIG. 2 illustrates in block diagram form a calibrated temperature sensor 200 according to some embodiments. Calibrated temperature sensor 200 includes a power sniffer logic circuit 210, a power-on ring oscillator 220, a temperature dependent ring oscillator (TRO) 230, and a measurement logic circuit 240. Power sniffer logic circuit 210 has an input for receiving a main power supply voltage labeled "$V_{DD}$", a control input for receiving a signal labeled "CALIB_DONE", and an output for providing a calibration enable signal labeled "CALIB_EN". Power-on ring oscillator 220 has an input for receiving the CALIB_EN signal, and an output for providing a signal labeled "POWERON_RO_CLK". TRO 230 has a first input for receiving the CALIB_EN signal, a second input for receiving a signal labeled "TRO_EN", and an output for providing a clock signal labeled "TRO_CLK".

Measurement logic circuit 240 includes a multiplexer 242, a counter 244, a multiplexer 246, and a control logic circuit 248. Multiplexer 242 has a first input connected to the output of power-on ring oscillator 220 for receiving the POWERON_RO_CLK signal, a second input connected to the output of TRO 230 for receiving the TRO_CLK signal, a select input, and an output. Counter 244 has a count input connected to the output of multiplexer 242, a control input, and an output for providing a digital count signal labeled "DATA_OUT". Multiplexer 246 has a first input for receiving a system clock signal labeled "SYS_CLK", a second input connected to the output of power-on ring oscillator 220 for receiving the POWERON_RO_SIGNAL, a select input, and an output. Control logic circuit 248 has a first input connected to the output of multiplexer 246, a second input for receiving a system reset signal labeled "SYS_POWEROK", a third input for receiving the CALIB_EN signal, a first output connected to the select input of multiplexer 242, a second output connected to the control input of counter 244 for providing various control signals, a third output connected to the select input of multiplexer 246, a fourth output for providing the CALIB_DONE signal, and a fifth output for providing a signal labeled "SSTATE".

In operation, power sniffer logic circuit 210 receives normal power supply voltage $V_{DD}$ and activates the CALIB_EN signal in response to $V_{DD}$ reaching a first threshold level. It subsequently de-activates the CALIB_EN signal in response to control logic circuit 248 inactivating the CALIB_DONE signal.

Power-on ring oscillator 220 is an uncalibrated ring oscillator that receives the CALIB_EN signal and oscillates to provide the power on clock signal POWERON_RO_CLK signal in response.

TRO 230 is responsive to an activation of either the CALIB_EN signal or the TRO_EN signal to provide temperature dependent clock signal TRO_CLK. During power up, power sniffer logic circuit 210 autonomously provides the CALIB_EN signal. During normal operation, an external circuit such as a system management unit (SMU) activates the TRO_EN signal to obtain a temperature measurement, and calibrated temperature sensor 200 provide the DATA_OUT signal according to the measured temperature in response.

Control logic circuit 248 sequences calibrated temperature sensor 200 through three calibration periods and a subsequent normal operation mode. During the first calibration period, measurement logic circuit 240 counts a first number of pulses of the TRO_CLK signal using the power on clock signal. After power up power sniffer logic circuit 210 activates the CALIB_EN signal (CALIB_EN=1), and control logic circuit 248 selects the second input of multiplexer 242 (TRO_CLK) and the second input of multiplexer 246 (POWERON_RO_CLK). Control logic circuit 248 indicates the first calibration period using a first code for the S STATE signal. Counter 244 counts pulses of the TRO_CLK signal in synchronism with the POWERON_RO_CLK signal. In one embodiment, counter 244 is a 16-bit up counter and counter 244 provides the DATA_OUT signal to indicate the number of pulses of the TRO_CLK signal over a predetermined number of pulses of the POWERON_RO_CLK signal.

During the second calibration period, measurement logic circuit 240 counts a second number of pulses of the TRO_CLK signal using the SYS_CLK signal. The SYS_CLK signal has a stable frequency of, for example, 25 megaHertz (MHz). The second calibration period occurs after the external system has powered up sufficiently, i.e. $V_{DD}$ has reached a second threshold level. The external system activates the SYS RESET signal. In response to the activation of the SYS RESET signal, control logic circuit 248 activates the second input of multiplexer 242 and the first input of multiplexer 246, and control logic circuit 248 operates in synchronism with the SYS_CLK signal. Control logic circuit 248 indicates the second calibration period using a second code for the SSTATE signal. Counter 244 counts pulses of the TRO_CLK signal in synchronism with the SYS_CLK signal and provides the DATA signal to indicate the number of pulses of the TRO_CLK signal over a predetermined number of pulses of the SYS_CLK signal defining a sample clock interval.

During the third calibration period, measurement logic circuit 240 counts a third number of pulses of the POWERON_RO_CLK signal using the SYS_CLK signal. The third calibration period also occurs after $V_{DD}$ has reached the second threshold level and the external system has activated the SYS RESET signal. Control logic circuit 248 activates the first input of multiplexer 242 and the first input of multiplexer 246, and control logic circuit 248 operates in synchronism with the SYS_CLK signal. Control logic circuit 248 indicates the third calibration period using a third code for the S STATE signal. Counter 244 counts pulses of the POWERON_RO_CLK signal in synchronism with the SYS_CLK and provides the DATA signal to indicate the number of pulses of the POWERON_RO_CLK signal over a predetermined number of pulses of the SYS_CLK signal defining a sample clock interval.

An external temperature and power manager, such as an on-chip SMU, reads the first, second, and third numbers of pulses and creates a frequency-to-temperature table for TRO 230. The external temperature and power manager uses the frequency-to-temperature table subsequently during the normal operation mode for accurate, calibrated temperature measurements.

Note that control logic circuit 248 can switch the order of the second and third calibration periods. The only requirement is that the first calibration period precedes both the second calibration period and the third calibration period.

At the end of the third calibration period, control logic circuit 248 activates the CALIB_DONE signal. Power sniffer logic circuit 210 de-activates the CALIB_EN signal in response to the CALIB_DONE signal, and deactivates power-on ring oscillator 220. It also de-activates TRO 230. Control logic circuit 248 selects the second input of multiplexer 242 and the first input of multiplexer 246 and indicates the normal operation mode using a fourth code for the S STATE signal. Thereafter during the normal operation mode, the external temperature and power manager can selectively activate the TRO_EN signal to cause TRO 230 to oscillate at a frequency that is proportional to the temperature and capture the number of pulses of the TRO_CLK over the sample interval.

Thus calibrated temperature sensor 200 operates based on the same $V_{DD}$ power supply voltage that is used to power the rest of the chip, avoiding the need to route a special, always-on power supply voltage to the temperature sensors scattered throughout the chip. It also obtains a baseline temperature measurement from TRO 230 in the form of a number of clock pulses over a sample interval before the heat generated by leakage currents from the $V_{DD}$ power supply propagates to TRO 230. Moreover as soon as the stable frequency system clock is available, it obtains measurements of the frequency of the uncalibrated power-on ring oscillator, and uses all of these measurements to create a highly accurate frequency-to-temperature table. Calibrated temperature sensor 200 leverages the fact that it takes a finite amount of time for heat to propagate through solids such as doped semiconductors, and calibrated temperature sensor 200 takes readings of TRO 230 using the uncalibrated power-on ring oscillator 220 before any heat generated by leakage currents on $V_{DD}$ or by operation of other circuits starts.

Moreover power sniffer logic circuit 210 enables this operation while $V_{DD}$ is still ramping up at power on so that most of the remainder of the chip is not yet operational. Thus power sniffer logic circuit 210 starts the sequence that obtains a baseline frequency measurement for TRO 230 when the integrated circuit is still at ambient temperature. This baseline frequency measurement can be used to offset actual frequency measurements when the operation of the integrated circuit raises the die temperature.

Figure 3:
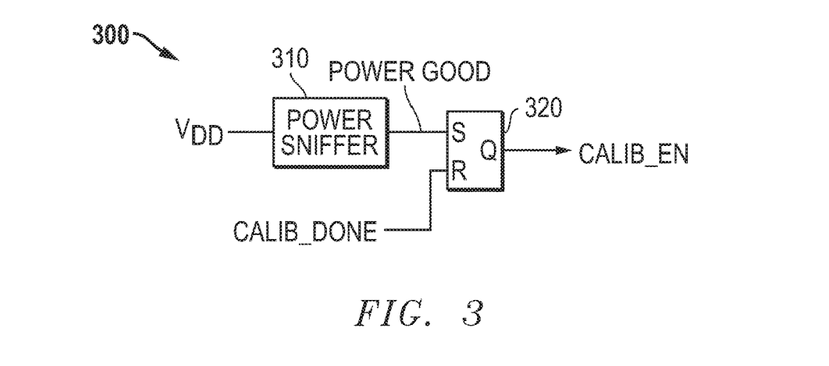
FIG. 3 illustrates in block diagram form a power sniffer logic circuit suitable for use in the calibrated temperature sensor of FIG. 2.

FIG. 3 illustrates in block diagram form a power sniffer logic circuit 300 suitable for use in calibrated temperature sensor 200 of FIG. 2. Power sniffer logic circuit 300 includes generally a power sniffer circuit 310 and a latch 320. Power sniffer 310 has an input for receiving power supply voltage $V_{DD}$, and an output. Latch 320 is a reset dominant SR-type latch having an S input connected to the output of power sniffer circuit 310, an R input for receiving the CALIB_DONE signal, and a Q output for providing the CALIB_EN signal. Power sniffer circuit 310 determines whether $V_{DD}$ is sufficiently large to operate the circuitry in calibrated temperature sensor 200. For example it compares a reference voltage, such as a bandgap voltage or a voltage derived from a bandgap voltage, to a fraction of $V_{DD}$ obtained by dividing $V_{DD}$ in a resistor ladder, and activates the POWERGOOD signal when the fraction of $V_{DD}$ is greater than the bandgap reference voltage. Latch 320 is set on the activation of the POWERGOOD signal, and reset on the activation of the CALIB_DONE signal.

Figure 4:
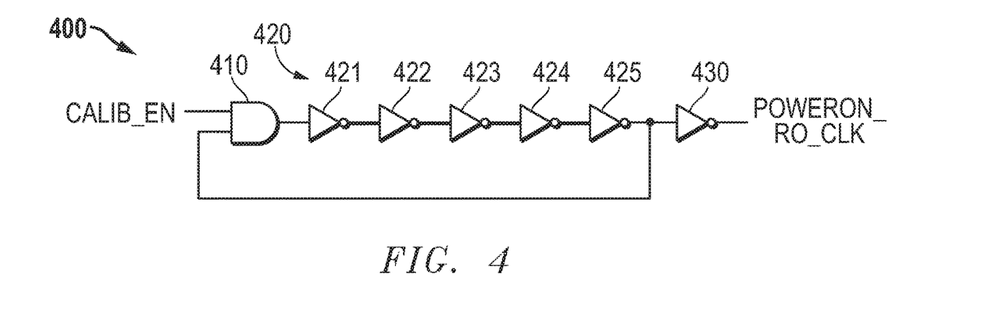
FIG. 4 illustrates in block diagram form a power on ring oscillator suitable for use in the calibrated temperature sensor of FIG. 2.

FIG. 4 illustrates in block diagram form a power on ring oscillator 400 suitable for use in calibrated temperature sensor 200 of FIG. 2. Power on ring oscillator 400 includes an AND gate 410, an inverter chain 420, and an output inverter 430. AND gate 410 has a first input for receiving the CALIB_EN signal, a second input, and an output. Inverter chain 420 include five inverters 421-425 in which an input of inverter 421 is connected to the output of AND gate 410, an output of each subsequent inverter is connected to the output of its preceding inverter in the chain, and the output of the last inverter 425 is connected to the second input of AND gate 410. Inverter 430 has an input connected to the output of inverter 425, and an output for providing the POWERON_RO_CLK signal. Power on ring oscillator 400 includes AND gate 410 to enable and disable the ring oscillator in response to the CALIB_EN signal. When CALIB_EN is low, the output of AND gate 410 is low and power-on ring oscillator 400 is disabled. When CALIN_B_EN is high, the output of AND gate 410 follows the output of inverter 425, and power on ring oscillator 400 oscillates at a speed dependent on the gate delays through inverter chain 420. Inverter chain 420 includes an odd number of inverters to ensure oscillation, but in other embodiments a different odd number besides five can be used. Since power-on ring oscillator 400 is uncalibrated, its oscillation frequency will vary with process, power supply voltage, and ambient temperature but the external power controller can compensate for the variation when the clock pulses are counted using the stable SYS_CLK during the third calibration period.

Figure 5:
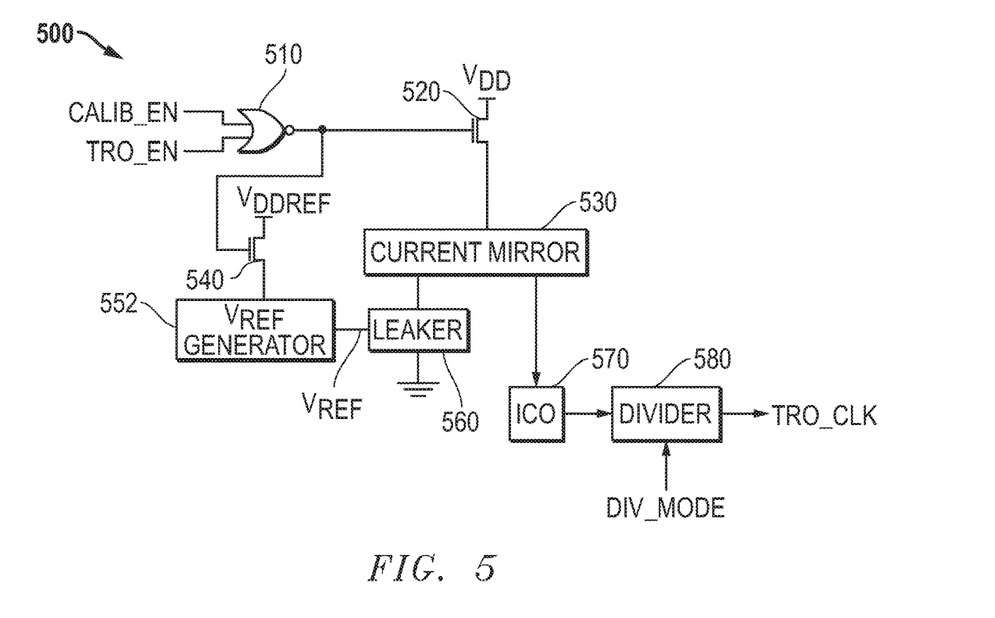
FIG. 5 illustrates in partial block diagram and partial schematic form a temperature dependent ring oscillator (TRO) suitable for use in the calibrated temperature sensor of FIG. 2.

FIG. 5 illustrates in partial block diagram and partial schematic form a temperature dependent ring oscillator (TRO) 500 suitable for use in the calibrated temperature sensor of FIG. 2. TRO 500 includes a NOR gate 510, a transistor 520, a current mirror 530, a transistor 540, a voltage reference generator 550, a leaker circuit 560, a current controlled oscillator 570 labeled "ICO", and a divider 580.

NOR gate 510 has a first input for receiving the CALIB_EN signal, a second input for receiving a signal labeled "TRO_EN", and an output. Transistor 520 is an N-channel transistor having a drain connected to a power supply voltage terminal labeled "$V_{DD}$", a gate connected to the output of NOR gate 510, and a source. Current mirror 530 has a power supply terminal connected to the source of transistor 520, an input, and an output. Transistor 540 is an N-channel transistor having a drain connected to $V_{DD}$, a gate connected to the output of NOR gate 510, and a source. Reference voltage generator 550 has an input connected to $V_{DD}$, and an output for providing a reference voltage labeled "$V_{REF}$". Leaker 550 has a first terminal connected to the input of current mirror 530, a second terminal connected to ground, and a control terminal for receiving $V_{REF}$. Current controlled oscillator 570 has a first terminal connected to the output of leaker current mirror 530, and an output terminal. Divider 580 has an input terminal connected to the output of current controlled oscillator 570, a control input for receiving a signal labeled "DIV_MODE", and an output for providing the TRO_CLK signal.

TRO 500 is enabled by the activation at a logic high of either the CALIB_EN signal or the TRO_EN signal. The TRO_EN signal is provided by, for example, an external power management unit. Leaker circuit 560 establishes a reference current into current mirror 530 that is porportional to temperature. Leaker circuit 560 can include, for example, an N-channel leaker transistor having its gate and source connected to ground in series with an N-channel cascode transistor having a drain connected to the input of current mirror 530, a gate for receiving $V_{REF}$, and a source connected to the drain of the leaker transistor. The cascode transistor maintains a constant drain-to-source voltage ($V_{DS}$) across the leaker transistor constant even with supply voltage variations. Providing a constant $V_{DS}$ across the leakage transistor ensures that the variation in leakage current depends primarily on variations in temperature and the dependence on voltage variations is negligible since the circuit cascode transistor keeps the leaker transistor at a constant current for any supply voltage at a particular temperature. Current through the leaker transistor varies substantially only with temperature and increases exponentially with increasing temperature.

Current mirror 530 amplifies the reference current to provide a control current proportional to the reference current. Current controlled oscillator 570 provides a clock signal at a frequency proportional to the control current and also to the temperature-dependent leakage current. Divider 580 is responsive to the DIV_MODE signal to provide the TRO_CLK signal at a fraction of the frequency of the clock signal at the output of current controlled oscillator 570 selected by the DIV_MODE signal.

While TRO 500 is especially useful in generating an output signal whose frequency varies with temperature, other temperature dependent ring oscillators can be used as well.

Figure 6:
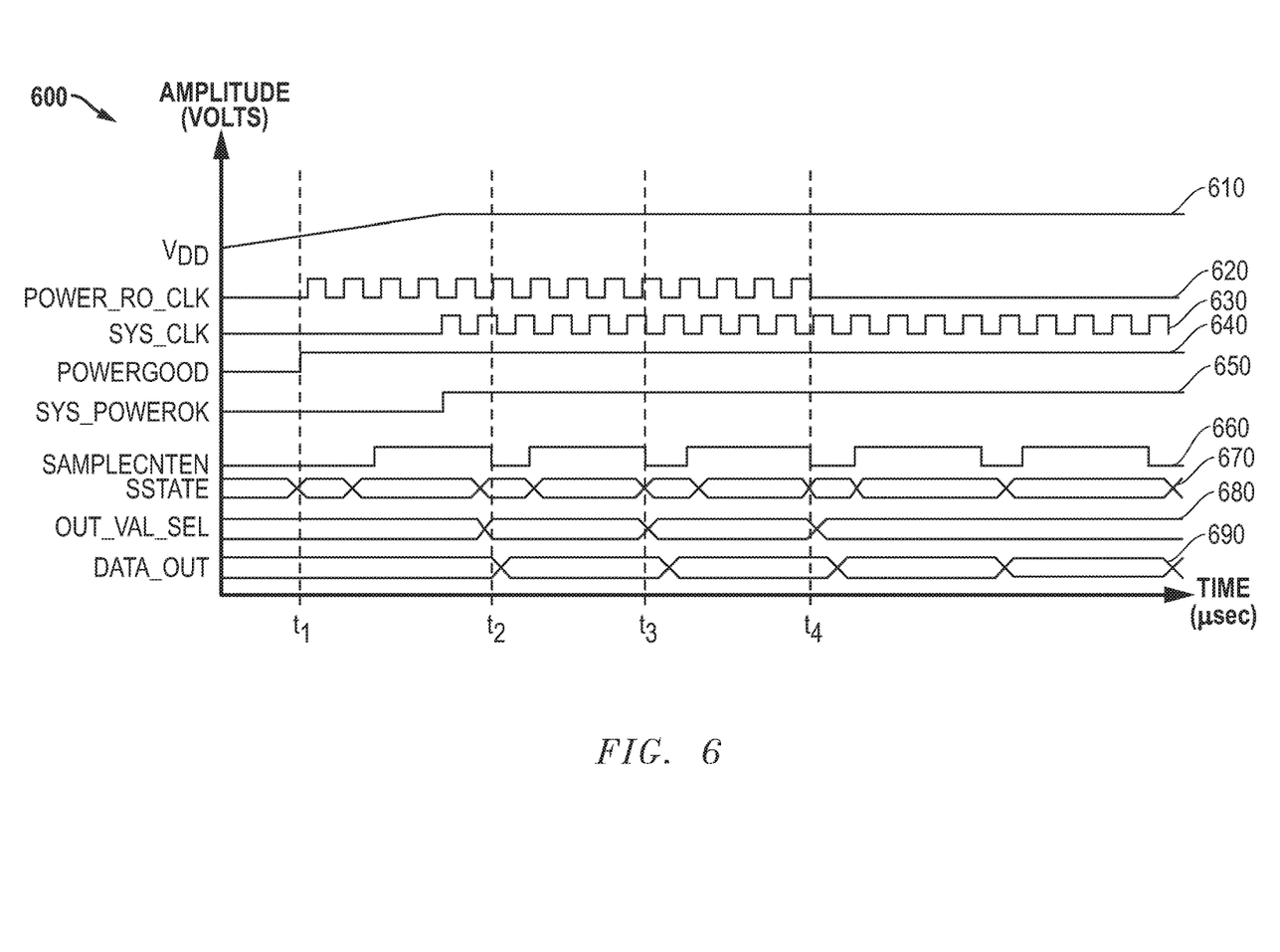
FIG. 6 illustrates a timing diagram showing the operation of the calibrated temperature sensor of FIG. 2.

FIG. 6 illustrates a timing diagram 600 showing the operation of calibrated temperature sensor 200 of FIG. 2. In FIG. 6 the horizontal axis represents time in a suitable scale such as microseconds (μsec), and the vertical axis represents the amplitude of various signals in volts. Timing diagram 600 shows waveforms of several signals of interest, including a waveform 610 of power supply voltage $V_{DD}$, a waveform 620 of the POWERON_RO_CLK signal, a waveform 630 of the SYS_CLK signal, a waveform 640 of the POWERGOOD signal, a waveform 650 of the SYS_POWEROK signal, a waveform 660 of a signal labeled "SAMPLECNTEN", a waveform 670 of the S STATE signal, a waveform 680 of a signal labeled "OUT_VAL_SEL", and a waveform 690 of the DATA_OUT signal. Shown in timing diagram 900 are several time points of interest, including times labeled "$t_1$", "$t_2$", "$t_3$", and "$t_4$".

At power up, $V_{DD}$ ramps from 0 volts to its final value. At time $t_1$, $V_{DD}$ crosses the first threshold and power sniffer logic circuit 210 activates the POWERGOOD signal that sets the CALIB_EN signal to a high state. The activation of the CALIB_EN signal starts power-on ring oscillator 220 and TRO 230 and initializes the finite state machine in control logic circuit 248. The first calibration period of calibration mode occurs between times $t_1$ and $t_2$. Control logic circuit 248 supports a variable sample delay measured in POWERON_RO_CLK pulses from the activation of CALIB_EN until it enables counter 244 to count the number of cycles of the TRO_CLK, and a variable sample size measured in POWERON_RO_CLK pulses number until it captures a sample of the number of pulses of the TRO_CLK signal. Control logic circuit 248 provides the SAMPLECNTEN signal to the control input of counter 244 to start and end the counting of cycles of the TRO_CLK signal. Control logic circuit 248 indicates its internal state on the S STATE signal, in which it indicates a wait condition during the sample delay and a "CALIB1" state thereafter. The OUT_VAL_SEL signal is initialized to 0 and remains at 0 until the end of the first calibration period.

The second calibration period of calibration mode occurs between times $t_2$ and $t_3$ and begins after the end of the first calibration period in response to the activation of the SYS_POWEROK signal. During the second calibration period, measurement logic circuit 240 counts the number of pulses of the TRO_CLK signal that occur during a number of cycles of the SYS_CLK signal determined by the sample size. Control logic circuit 248 indicates its internal state on the S STATE signal, in which it indicates a wait condition during the sample delay and a "CALIB2" state thereafter. The OUT_VAL_SEL signal increments to 1 and the DATA_OUT signal indicates the value of the counter during the CALIB1 phase.

The third calibration period of calibration mode occurs between times $t_3$ and $t_4$. During the third calibration period, measurement logic circuit 240 counts the number of pulses of the POWERON_RO_CLK signal that occur during the number of cycles of the SYS_CLK signal determined by the sample size. Control logic circuit 248 indicates its internal state on the S STATE signal, in which it indicates a WAIT state during the sample delay and a "CALIB3" state thereafter. The OUT_VAL_SEL signal increments to 2 and the DATA_OUT signal indicates the value of the counter during the CALIB2 phase. At around time $t_4$, control logic circuit 248 activates the CALIB_DONE signal, which disables the power-on ring oscillator 220. As noted above, the order of the second and third measurements is arbitrary and while they both follow the first calibration period, in other embodiments the order of the second and third calibration periods can be reversed.

After the third calibration period that ends at time $t_4$, measurement logic circuit 240 enters the normal operation or run mode. Control logic circuit 248 indicates its internal state on the SSTATE signal, in which it indicates a WAIT for one clock period and a "RUN" state thereafter. The OUT_VAL_SEL signal increments to 3 and the DATA_OUT signal indicates the value of the counter during the CALIB3 phase during the next set of pulses of the clock pulses, and thereafter temperature measurements obtained during successive sample periods in the normal operation mode.

Figure 7:
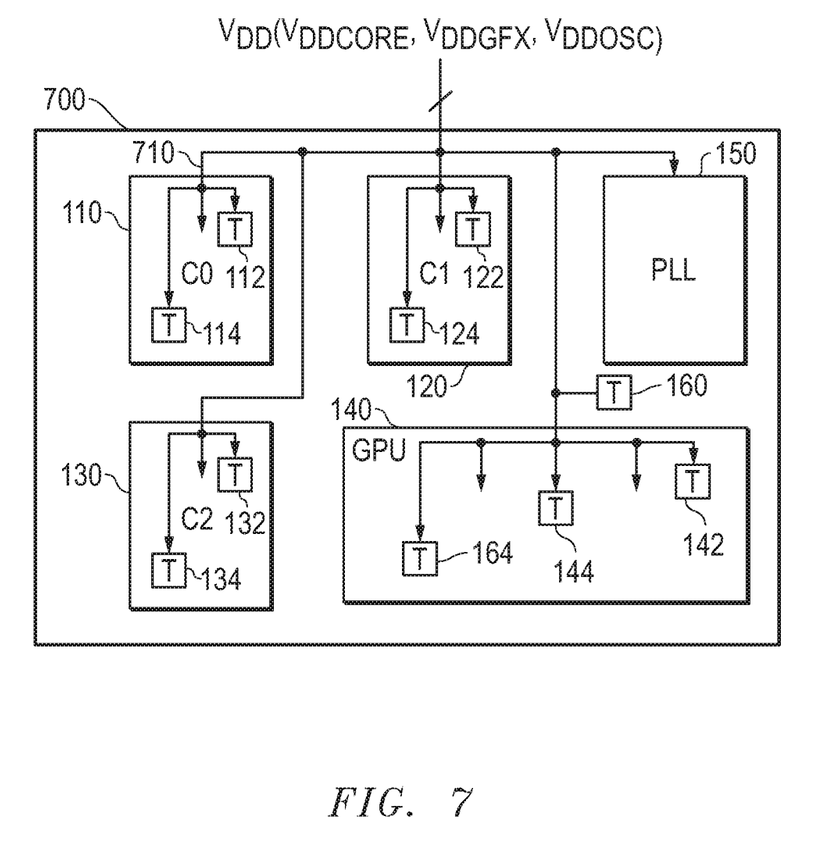
FIG. 7 illustrates in block diagram an integrated circuit with calibrated temperature sensors according to some embodiments.

FIG. 7 illustrates in block diagram an integrated circuit 700 with calibrated temperature sensors according to some embodiments. Integrated circuit 700 is similar to integrated circuit 100 and includes CPU cores 110, 120, and 130, GPU core 140, and PLL 150 along with the temperature sensors as previously illustrated. However integrated circuit 700 differs from integrated circuit 100 in that the temperature sensors are connected to the normal $V_{DD}$ that is provided to and routed within each core. Thus the $V_{DD}$ can be the same $V_{DD}$ if the whole chip uses the same power plane, or different $V_{DD}$s that are normally used by the cores that the temperature sensors are located in if the cores occupy different power planes. In this case each temperature sensor can be substantially as constructed as in FIGS. 2-5.

Integrated circuit 700 or any portion thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. Accordingly, to the maximum extent allowed by law, the scope of the present invention is to be determined by the broadest permissible interpretation of the following claims and their equivalents, and shall not be restricted or limited by the foregoing detailed description.

What is claimed is:

1. A calibrated temperature sensor comprising:
   a power on oscillator responsive to a calibration enable signal for providing a power on clock signal;
   a temperature dependent oscillator responsive to said calibration enable signal for providing a temperature dependent clock signal; and
   a measurement logic circuit for counting a first number of pulses of said temperature dependent clock signal during a first calibration period using said power on clock signal, a second number of pulses of said temperature dependent clock signal during a second calibration period using a system clock signal, a third number of pulses of said power on clock signal over a third calibration period using said system clock signal, and a fourth number of pulses of said temperature dependent clock signal using said system clock signal during a normal operation mode, wherein said first calibration period precedes both said second and said third calibration periods.

2. The calibrated temperature sensor of claim 1, further comprising:
   a power sniffer logic circuit having an input for receiving a power supply voltage, and an output for providing said calibration enable signal in response to said power supply voltage reaching a predetermined level.

3. The calibrated temperature sensor of claim 2, wherein said power sniffer logic circuit comprises:
   a power sniffer circuit having an input for receiving said power supply voltage, and an output for providing a power good signal when said power supply voltage exceeds a threshold; and
   a latch that activates said calibration enable signal in response to an activation of said power good signal, and clears said calibration enable signal in response to an activation of a calibration done signal,
   wherein said measurement logic circuit activates said calibration done signal in said normal operation mode.

4. The calibrated temperature sensor of claim 1, wherein said power on oscillator comprises a ring oscillator.

5. The calibrated temperature sensor of claim 1, wherein said temperature dependent oscillator comprises a ring oscillator.

6. The calibrated temperature sensor of claim 1, wherein said temperature dependent oscillator further comprises a current-controlled ring oscillator.

7. The calibrated temperature sensor of claim 1, wherein said measurement logic circuit comprises:
   a first multiplexer having a first input for receiving said power on clock signal, a second input for receiving said temperature dependent clock signal, a control input for receiving said calibration enable signal, and an output;
   a counter having an input coupled to said output of said first multiplexer, a control input for receiving an oscillator enable signal, and an output for providing a data signal representative of a number of clock pulses counted in a selected mode;
   a second multiplexer having a first input for receiving said power on clock signal, a second input for receiving said system clock signal, a control input for receiving said calibration enable signal, and an output; and
   a control logic circuit responsive to said output of said second multiplexer for providing said oscillator enable signal and said calibration done signal.

8. The calibrated temperature sensor of claim 1, wherein said second calibration period precedes said third calibration period.

9. The calibrated temperature sensor of claim 1, wherein said third calibration period precedes said second calibration period.

10. An integrated circuit comprising:
    a functional unit for receiving a power supply voltage and performing a predetermined operation in a normal operation mode in response to said power supply voltage;
    wherein said functional unit comprises a calibrated temperature sensor that operates using said power supply voltage and provides a temperature signal in a normal operation mode, said calibrated temperature sensor comprising:
    a power on oscillator responsive to a calibration enable signal for providing a power on clock signal;
    a temperature dependent oscillator responsive to said calibration enable signal for providing a temperature dependent clock signal; and
    a measurement logic circuit for counting a first number of pulses of said temperature dependent clock signal during a first calibration period using said power on clock signal, a second number of pulses of said temperature dependent clock signal during a second calibration period using a system clock signal, a third number of pulses of said power on clock signal over a third calibration period using said system clock signal, and a fourth number of pulses of said temperature dependent clock signal using said system clock signal during a normal operation mode, wherein said first calibration period precedes both said second and third calibration periods.

11. The integrated circuit of claim 10, wherein said power on oscillator comprises a ring oscillator.

12. The integrated circuit of claim 10, wherein said temperature dependent oscillator comprises a ring oscillator.

13. The integrated circuit of claim 12, wherein said temperature dependent oscillator further comprises a current-controlled ring oscillator.

14. The integrated circuit of claim 10, wherein the integrated circuit is a data processor and the functional unit comprises one of a central processing unit core and a graphics processing unit (GPU) core.

15. The integrated circuit of claim 10, further comprising:
a system management unit responsive to said first, second, third, and fourth numbers of pulses to determine a temperature in said normal operation mode and to make a power management decision in response to said temperature exceeding a temperature threshold.

16. A method comprising:
providing a power on clock signal in response to a calibration enable signal;
providing a temperature dependent clock signal using a temperature dependent oscillator in response to said calibration enable signal; and
counting a first number of pulses of said temperature dependent clock signal during a first calibration period using said power on clock signal;
counting a second number of pulses of said temperature dependent clock signal during a second calibration period using a system clock signal;
counting a third number of pulses of said power on clock signal over a third calibration period using said system clock signal, wherein said first calibration period precedes both said second and third calibration periods; and
counting a fourth number of pulses of said temperature dependent clock signal using said system clock signal during a normal operation mode.

17. The method claim 16, wherein said counting said second number of pulses precedes said counting said third number of pulses.

18. The method claim 16, wherein said counting said third number of pulses precedes said counting said second number of pulses.

19. The method of claim 16, further comprising:
powering said temperature dependent oscillator with a power supply voltage during said normal operation mode; and
powering a functional unit thermally coupled to said temperature dependent oscillator with said power supply voltage during said normal operation mode.

20. The method of claim 16, further comprising:
determining a temperature in said normal operation mode responsive to said first, second, third, and fourth numbers of pulses; and
making a power management decision in response to said temperature exceeding a temperature threshold.

* * * * *